United States Patent [19]
Reimers

[11] Patent Number: 5,902,714
[45] Date of Patent: May 11, 1999

[54] LATEX-BASED, AQUEOUS DEVELOPABLE PHOTOPOLYMERS AND USE THEREOF IN PRINTING PLATES

[75] Inventor: Jay L. Reimers, Atlanta, Ga.

[73] Assignee: Polyfibron Technologies, Inc., Atlanta, Ga.

[21] Appl. No.: 08/902,644

[22] Filed: Jul. 30, 1997

[51] Int. Cl.$^6$ .............................. G03C 1/73; G03F 7/032
[52] U.S. Cl. .................... 430/287.1; 430/286.1; 430/281.1; 430/910; 430/270.1; 522/112
[58] Field of Search .............................. 430/286.1, 287.1; 522/112

[56] References Cited

U.S. PATENT DOCUMENTS

| | | | |
|---|---|---|---|
| 5,073,477 | 12/1991 | Kusuda et al. | 430/287 |
| 5,344,744 | 9/1994 | Ueda et al. | 430/287 |
| 5,622,813 | 4/1997 | Kanda et al. | 430/281.1 |
| 5,679,485 | 10/1997 | Suzuki et al. | 430/18 |
| 5,731,129 | 3/1998 | Koshimura et al. | 430/286.1 |
| 5,736,298 | 4/1998 | Koshimura et al. | 430/287.1 |

FOREIGN PATENT DOCUMENTS

| | | |
|---|---|---|
| 0 356 953 A2 | 3/1990 | European Pat. Off. . |
| 0 513 493 A1 | 11/1992 | European Pat. Off. . |
| 0 552 799 A1 | 7/1993 | European Pat. Off. . |
| 0 667 561 A1 | 8/1995 | European Pat. Off. . |

OTHER PUBLICATIONS

Chemical Abstracts Registry No. 28805–58–5, American Chemical Society, 1998.

Chemical Abstracts Registry No. 26680–54–6, American Chemical Society, 1998.

Chemical Abstracts Registry No. 29658–97–7, American Chemical Society, 1998.

Chemical Abstracts Registry Numer 25377–73–5, American Chemical Society, 1998.

Odian, "Emulsion Polymerization", *Principles of Polymerization*, 2nd Ed., John Wiley & Sons, 1981, 319–339.

*Primary Examiner*—Kathleen Duda
*Assistant Examiner*—Jill N. Hackathorn
*Attorney, Agent, or Firm*—Woodcock Washburn Kurtz Mackiewicz & Norris, LLP

[57] ABSTRACT

Aqueous developable photocurable compositions are provided. The compositions can be formed from a latex polymer and a rubber, and are water dispersible. The compositions are useful in forming flexographic printing plates.

23 Claims, 1 Drawing Sheet

LATEX-BASED, AQUEOUS DEVELOPABLE PHOTOPOLYMERS AND USE THEREOF IN PRINTING PLATES

FIELD OF THE INVENTION

The present invention is directed to latex-based aqueous developable photopolymers, particularly those which are useful in the manufacture of printing plates. The photpolymers preferably are formed in a single polymerization step.

BACKGROUND OF THE INVENTION

Photocurable compositions are used in forming printing plates and other photosensitive articles. In the field of photosensitive flexographic printing plates, the uncured plate typically includes a support and a photocurable surface or layer. Additional layers or surfaces on the plate can include, for example, slip films and/or release layers to protect the photocurable surface. Prior to processing the plate, the release layer typically is removed, and the photocurable layer is exposed to radiation in an imagewise fashion. Unexposed areas of the photocurable layer are then removed in developer baths.

In the past, unexposed areas of the photocurable layer were removed using developer baths comprising organic solvents. However, the toxicity, volatility, and low flash point of such solvents give rise to hazardous conditions and pollution problems. As a result, there has been a recognition of the need to provide photocurable composition which can be developed in, for example, aqueous solvents.

A flexographic printing plate not only should possess a photocurable layer, but also should have sufficient flexibility to wrap around a printing cylinder and sufficient structural integrity to withstand the rigors experienced during typical printing processes. The printing plate should also be soft enough to facilitate ink transfer during printing, and should exhibit solvent resistance to inks, including resistance to the various organic and aqueous-based inks which are used in flexographic printing.

Several approaches have been taken to answer the need for aqueous developable compositions for flexographic printing. One approach, described in European Patent Application No. 552,799 Al, involves the use of a two-step polymerization process to form a core/shell structure wherein a crosslinked shell is polymerized onto an elastomeric core. Formation of a core/shell structure generally requires two polymerization steps, and two monomer mixtures. Another approach, described in European Patent Application No. 513,493 Al, involves the use of a composition comprising a hydrophilic polymer.

There remains a need for aqueous developable polymers which can, if desired, be formed in a single polymerization step and which allow for flexibility in the choice of monomers. Such polymers should maintain an appropriate balance of properties such as flexibility and structural integrity, while being resistant to organic and aqueous-based inks. The present invention is directed to these and other important ends.

SUMMARY OF THE INVENTION

The present invention provides, in one aspect, synthetic methods comprising providing a mixture of ethylenically unsaturated monomers, wherein at least one of the monomers is a surfactant monomer having the structure:

$R_1$—C=C—$R_2$ wherein $R_1$ is a hydrophobic moiety and $R_2$ is a hydrophilic moiety. These monomers are reacted for a time and under conditions which effect polymerization thereof, thereby forming a latex polymer. The latex polymer, in turn, is mixed with at least one ethylenically unsaturated rubber, at least one additional ethylenically unsaturated monomer and at least one photoinitiator. In certain embodiments, the latex polymer is dried before it is mixed with the rubber, monomer, and photoinitiator.

In another aspect, the present invention provides photocurable compositions comprising an ethylenically unsaturated rubber, at least one photoinitiator, and the reaction product produced by polymerizing a mixture of ethylenically unsaturated monomers, wherein at least one of said monomers is a surfactant monomer having the structure $R_1$—C=C—$R_2$. At least one additional ethylenically unsaturated monomer can be included in the photocurable composition. The additional monomer can be admixed with the other components of the composition following initial polymerization of the mixture of monomers.

The present invention also provides photocurable elements comprising a layer of a photocurable composition disposed upon a support layer.

BRIEF DESCRIPTION OF THE DRAWINGS

The numerous objects and advantages of the present invention may be better understood by those skilled in the art by reference to the accompanying non-scale figures, in which.

DETAILED DESCRIPTION OF THE INVENTION

Figure 1:
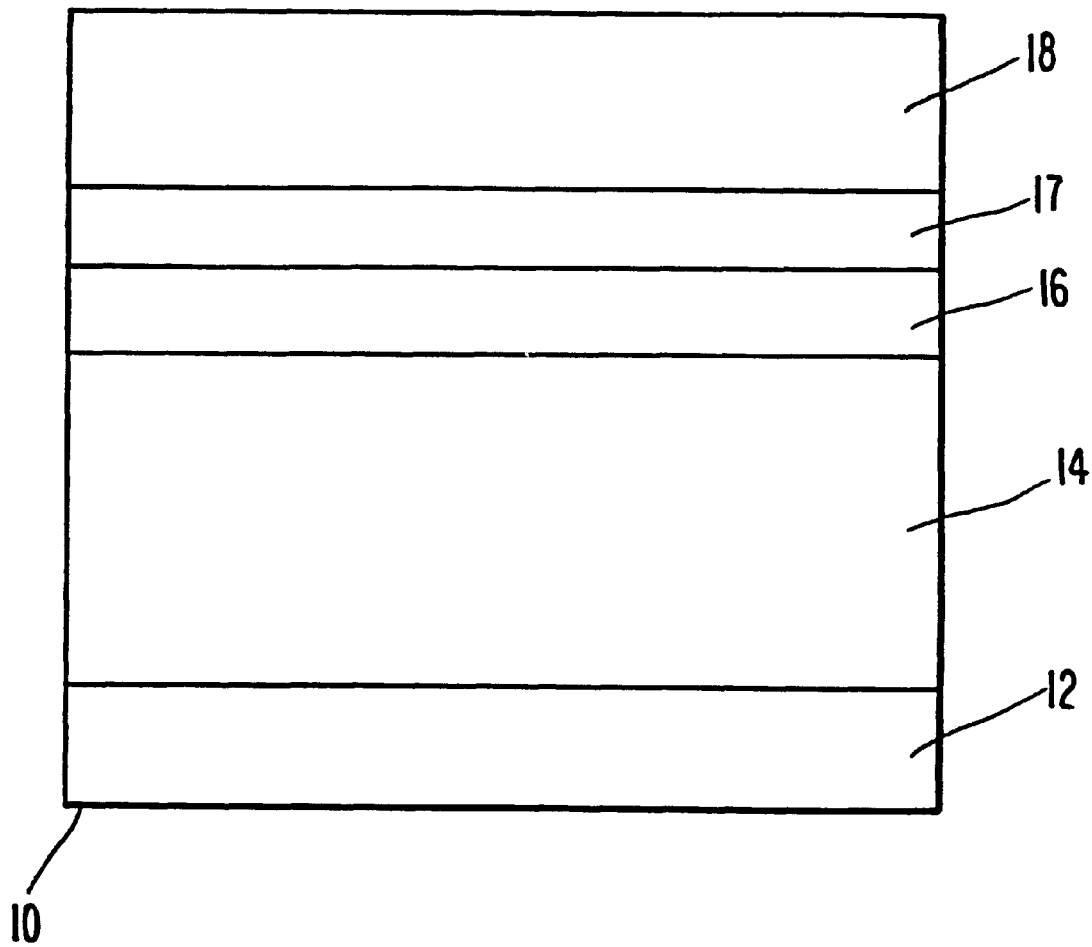
FIG. 1 is a cross-sectional view of a photocurable element according to the invention.

The ethylenically unsaturated monomers according to the invention can be hydrophilic or hydrophobic, or a combination of hydrophilic and hydrophobic monomers can be used. It is preferred that the ethylenically unsaturated monomers used in forming the latex polymer include both monofunctional monomers and polyfunctional monomers.

Exemplary monofunctional monomers include alkyl acrylates and alkyl methacrylates, monomers containing carboxylic acid groups, monomers containing hydroxyl groups, aliphatic conjugated diene monomers, polymerizable amides, vinyl ethers, vinyl esters, styrenes, vinyl ketones, olefins, polymerizable nitriles, and monomers having sulfonic or phosphoric groups. Particular examples of suitable alkyl acrylates and alkyl methacrylates include methyl (meth)acrylate, ethyl (meth)acrylate, n-butyl (meth)acrylate, propyl (meth)acrylate, 2-ethyl-hexyl (meth)acrylate, lauryl (meth)acrylate, stearyl (meth)acrylate, acyl (meth)acrylate, cyclohexyl (meth)acrylate, dimethylaminoethyl (meth)acrylate. Other useful acrylates include octyl acrylate and 2-chloroethyl acrylate. Monomers containing carboxylic acid groups include acrylic acid, methacrylic acid, maleic acid, fumaric acid, tetracosanoic acid, and crotonic acid. Exemplary hydroxyl group-containing monomers include 2-hydroxyethyl (meth)acrylate, hydroxypropyl (meth) acrylate, hydroxybutyl (meth)acrylate, allyl alcohol, methallyl alcohol, N-(4-hydroxyphenyl)acrylamide, N-(4-hydroxyphenyl)methacrylamide, o-hydroxystyrene, m-hydroxystyerene, p-hydroxystyrene, and o-, m-, or p-hydroxyphenyl (meth)acrylate. Particular examples of aliphatic conjugated diene monomers include 1,3-butadiene, isoprene, dimethybutadiene, 1,3-pentadiene, and chloroprene. Exemplary polymerizable amides include acrylamide, methacrylamide, N-methylolacrylamide, N-ethylacrylamide, N-hexylacrylamide, N-cyclohexylacrylamide, N-hydroxyethylacrylamide, N-phenylacrylamide, N-nitrophenylacrylamide, and N-ethyl-phenylacrylamide. Exemplary vinyl ethers include ethyl vinyl ether, 2-chloroethyl vinyl ether, hydroxyethyl vinyl ether, propyl vinyl ether, butyl vinyl ether, butyl vinyl ether, octyl vinyl ether, and phenyl vinyl ether. Exemplary styrenes include styrene, α-methyl styrene, methylstyrene, and chloromethylstyrene. Exemplary vinyl ketones include methyl vinyl ketone, ethyl vinyl ketone, propyl vinyl ketone, and phenyl vinyl ketone. Exemplary olefins include ethylene, propylene, isobutylene, and glycidyl(meth)acrylate. Exemplary polymerizable nitriles include acrylonitrile, methacrylonitrile, N-vinylpyrrolidone, N-vinylcarbazole, and 4-vinylpyridine. Exemplary monomers having sulfonic or phosphonic groups include vinylsulfonic acid, styrene-p-sulfonic acid, 2-sulfoxyethyl methacrylate, and 2-acrylamide-2-methylpropanesulfonic acid. Other monomers suitable for forming the crosslinked polymer will be readily apparent to one skilled in the art once armed with the present disclosure.

The photopolymerizable compositions of the present invention preferably are crosslinked. Crosslinking is generally accomplished by the use of one or more polyfunctional monomers. Polyfunctional monomers have more than one potential polymerization site, and can therefore become incorporated within more than one polymer chain and thus facilitate crosslinking between the polymer chains. Polyfunctional monomers include polyethylenically unsaturated monomers in which the ethylenically unsaturated groups preferably have approximately equal reactivity, such as divinyl benzene, polyethylenically unsaturated monomers in which the ethylenically unsaturated groups have different reactivities, and ethylenically unsaturated monomers containing carboxyl groups or epoxy groups.

Polyfunctional alkyl acrylates and alkyl methacrylates useful in the present invention include trimethylolpropane di(meth)acrylate, trimethylolpropane di(meth)acrylate, ethylene glycol di(meth)acrylate, pentaerythritol tri(meth)acrylate, pentaerythritol tetra(meth)acrylate, 1,4-butanediol di(meth)acrylate, 1,6-hexanediol di(meth)acrylate, triethylene glycol di(meth)acrylate, tetraethylene glycol di(meth)acrylate, polyethylene glycol di(meth)acrylate, pentaerythritol di(meth)acrylate, glycerol dimethacrylate, glycerolallyloxy di(meth)acrylate, 1,1,1-trishydroxymethylethane di(meth)acrylate, 1,1,1-trishydroxymethylethane tri(meth)acrylate, 1,1,1-trishydroxymethylpropane di(meth)acrylate, 1,1,1-trishydroxymethylpropane tri(meth)acrylate, triallyl cyanurate, triallyl isocyanurate, glycidyl (meth)acrylate, allyl methacrylate, diallyl maleate, allyl acryloxy propionate, triallyl cyanurate, triallyl isocyanurate, diallyl therephthalate, and diallyphthalate.

The latex polymers of the present invention are formed from surfactant monomers. The term "surfactant monomer", as used herein, refers to a compound which imparts dispersibility of the monomers, and the resulting polymer, in an aqueous medium. Preferably, surfactant monomers for use in the present invention contain at least one carbon-carbon double bond, a hydrophobic portion, and a hydrophilic portion. The structure of a surfactant monomer can be represented as:

wherein $R_1$ is a hydrophobic moiety and $R_2$ is a hydrophilic moiety. The hydrophobic moiety preferably is an alkyl or alkenyl group, and the hydrophilic moiety preferably is anionic (i.e., bears a negative charge or has substantial anionic character due, for example, to the electron-withdrawing nature of constituent atoms). Suitable alkyl groups have from 1 to about 30 carbon atoms, preferably from about 6 to about 20 carbon atoms, more preferably from about 8 to about 12 carbon atoms. Suitable alkenyl groups have from 2 to about 30 carbon atoms, preferably from about 6 to about 20 carbon atoms, more preferably from about 8 to about 12 carbon atoms. Preferred anionic hydrophilic moieties include a C=O, S=O, and/or P=O. More preferably, the anionic hydrophilic portion contains a succinate group. Particularly preferred polymerizable surfactants include octenyl succinic acid, octenyl succinic anhydride, dodecenyl succinic acid and dodecenyl succinic anhydride. Also useful are sulfonyl alkyl esters such as sulfopropyl methacrylate. The surfactant monomer can constitute from about 0.5 to about 8 weight percent of the monomers used to form the latex polymer, preferably from about 1 to about 3 weight percent.

The photocurable compositions of the invention can be formed in multiple polymerization steps, although it is possible to use only a single polymerization step. This is believed to be due to the fact that such compositions need not have a core/shell structure, and also due to the fact that the monomers used need not be hydrophilic. This allows for a relatively simple preparation process and for flexibility in choosing the polymers in the composition. The composition is also water-dispersible and aqueous developable.

The monomers are polymerized, preferably by emulsion polymerization, to form a latex polymer. Emulsion polymerization techniques are well known to those skilled in the art. Emulsion polymerization is discussed, for example, in Odian, *Principles of Polymerization*, 2nd. Ed., pp. 320–337 (John Wiley & Sons, 1981).

Once the monomers have been polymerized, the resulting latex polymer is blended with an ethylenically unsaturated rubber. Preferably, the rubber has a refractive index which is sufficiently close to that of the latex polymer that the blend appears transparent upon visual inspection. More preferably, the refractive indices of the latex polymer and the rubber are substantially the same, i.e. they differ by no more than about 0.006. Materials having refractive indices which are the same or substantially the same are referred to as "isorefractive". Generally, a rubber comprising at least one monomer of the type used in forming the crosslinked polymer will have an acceptable refractive index to provide a transparent blend.

The rubber with which the polymer is blended preferably is an elastomer. The term "elastomer" refers to polymers having little or no crystallinity when undistorted, and having a glass transition temperature, $T_g$ which is sufficiently low that at normal use and processing temperatures its polymeric chains are relatively mobile and the material can undergo reversible elongations to at least about twice its original length. For example, a $T_g$ within the range of from about −50° C. to about −80° C. is typical in elastomeric materials, and elastomers generally have $T_g$s of about −30° or less. Suitable elastomers for use in the present invention include polyisoprene, elastomeric terpolymers of ethylene, propylene and diene monomers (EPDM), neoprenes, butyl rubbers, rubbers derived from butadiene including styrene-butadiene rubber (SBR), and nitrile rubbers. For both refractive index matching and elastomeric properties, EPDM rubbers are highly preferred for use in the present invention.

Latex polymers preferably are dried before blending with the rubber. Drying can be accomplished by, for example, maintaining the polymer in an oven or a desiccating chamber for several hours, preferably at least 12 hours and more preferably at least about 24 hours. Drying can be carried at room temperature but preferably is carried out at a slightly elevated temperature, such as at least about 40° C. Suitable temperatures can be up to about 80° C., preferably about 60° C. The drying temperature should be well below the $T_g$ of the polymer. Alternative methods of drying include freeze-drying and spray drying, which techniques are well known to those skilled in the art.

Blending can be accomplished using methods known to those skilled in the art. For example, blending may be achieved by mechanical mixing or extrusion. The time and conditions required for blending will be apparent to one skilled in the art and will depend upon the composition and properties of the polymer and the rubber.

The blend is then formulated with one or more photoinitiators, one or more ethylenically unsaturated monomers, and optional other additives known to those skilled in the art, such as a plasticizer.

As the ethylenically unsaturated monomer to be formulated with the latex polymer/rubber blend, any acrylate or methacrylate monomer having a tertiary amino group or other basic can be used. The presence of the basic moiety facilitates interaction of the ethylenically unsaturated monomer with the anionic portion of the copolymerized surfactant to form a salt. Suitable types of ethylenically unsaturated monomers having a basic moiety include N-alkylacrylamide, N,N-dialkyl amino monoalkyl(meth) acrylates, N-alkyl amino alkyl (meth)acrylate, N,N,N-trialkyl amino alkyl (meth)acrylates, and cationic salts thereof. "Alkyl" refers to hydrocarbon chains having from 1 to about 10 carbon atoms, preferably up to about 8 carbon atoms, and more preferably up to about 6 carbon atoms. Exemplary acrylic monomers having a basic moiety include t-butylamino methyl methacrylate, N-methylamino acrylate), N-ethylamino acrylate, N,N-dimethyl amino acrylate), N,N-diethylamino acrylate, N-aminomethacrylate, N-methyl aminomethacrylate, N-ethyl aminomethacrylate, N,N-dimethylaminomethacrylate), N,N-diethyl aminomethacrylate, N,N,N-trimethylaminoacrylate chloride. Also useful are nitrogen-containing compounds including N-methylacrylamide, n-butylmethacrylamide, N-methylolacrylamide, N-butylaminoethyl(meth)acrylate, N,N'-diethylaminoethyl(meth)acrylate, N,N'-dimethyl aminoethyl(meth)acrylate, N,N'-dimethyl amino ethyl (meth)acrylate, and isobutoxy(meth)acrylamide. The ethylenically unsaturated monomer preferably produces a salt upon treatment with base, thereby increasing the solubility in water of materials into which the monomers are incorporated.

Suitable photoinitiators include polymerization initiators which are activated by actinic radiation, generally ultraviolet or visible radiation. As used herein, "actinic" radiation is radiation which is capable of effecting a chemical change in an exposed portion of the composition. Actinic radiation includes, for example, amplified (e.g., laser) and non-amplified light, particularly in the ultraviolet and infrared wavelength regions. Actinic radiation for use in the present invention preferably is in the wavelength region from about 250 nm to about 450 nm, more preferably from about 300 nm to about 400 nm, and most preferably from about 320 nm to about 380 nm. The photocurable compositions of the present invention preferably harden when exposed to actinic radiation.

Photoinitiators for use in the present invention can be soluble or insoluble in aqueous media. Exemplary photoinitiators include benzophenones (e.g., p-aminobenzophenone), acetophenones (e.g., 2,2-dimethoxy-2-phenylacetophenone), anthraquinones (e.g., 9,10-anthraquinone, 1-chloroanthroquinone, 2-chloroanthraquinone), xanthones, and benzoin ethers.

The photocurable compositions of the invention can be prepared by blending from about 10 percent to about 99 percent by weight (preferably from about 50 percent to about 80 percent by weight) of the latex polymer, from about 2 percent to about 30 percent by weight (preferably from about 8 percent to about 15 percent by weight) of the ethylenically unsaturated monomer, and from about 0.25 percent to about 2 percent by weight (preferably from about 0.5 percent to about 1.5 percent by weight) of the photoinitiator, based on the total composition.

Such photocurable compositions are useful in forming photocurable elements. A photocurable element is generally formed by placing a layer of the photocurable composition 14 onto a suitable support, or backing, layer 12, as shown in FIG. 1. The support layer can be formed from a transparent or opaque material such as paper, cellulose film, plastic, rubber, or metal. In preferred embodiments, the support layer is formed of polyethylene terephthalate film having a thickness of about 0.005 inch. The thickness of the photocurable layer can vary, but is generally from about 0.02 to about 0.35 inch. If necessary, an adhesive may be applied to the support material.

A photocurable element according to the present invention can be, for example, in the form of a cylinder or a rectilinear sheet or plate. If desired, a photocurable element can further comprise a second layer of photocurable material, a cover sheet, and a protective layer. If a second photocurable layer is used, it is typically disposed upon the first and is similar in composition but considerably thinner, generally less than about 0.01 inch. The protective layer, if used, is typically from about 0.001 to about 0.01 inch thick. The protective layer protects the photocurable element from contamination, increases ease of handling, and acts as an ink-accepting layer. The cover sheet, if used, forms the final layer and can be formed from any suitable material which protects the element from damage until ready for use. As will be recognized by one skilled in the art, exposure of the photocurable composition to actinic radiation should be avoided prior to development of the photocurable element into which the composition is incorporated.

In a typical developing process, a plate formed from a composition of the present invention is exposed to actinic radiation through a negative and polymerized at the light-exposed portions to form latent images. The exposed plate is then rinsed with water to yield relief images, dried and then post-exposed to radiation to form a flexographic printing plate.

The following examples are merely illustrative of the present invention and should not be considered limiting of the scope of the invention in any way. These examples and equivalents thereof will become more apparent to those skilled in the art in light of the present disclosure and the accompanying claims.

EXAMPLE 1

A latex polymer was formed by emulsion polymerizing 370 grams (g) of lauryl methacrylate, 10 g hexanediol diacrylate, and 20 g methyl methacrylate, in the presence of 62.56 g of the monosodium salt of octenyl succinic acid. The monomers were first washed with a solution of 5 percent NaOH to remove any inhibitors. Sodium persulfate (1.2 g) was used as a polymerization initiator. Polymerization was carried out in 1000 g deionized water under a nitrogen atmosphere at 55° C., for 3 hours.

Following completion of the reaction, the polymer was precipitated by acidifying the reaction medium with 24.4 g of a 37.4 (weight) percent solution of HCl. The precipitated polymer was dried at 60° C. for 24 hours. A blend was then formed of 160 g of the dry polymer and 80 g of EPDM (Uniroyal 535) in a Haake rotomizer. The blend was then formulated with 16 g of t-butylaminoethyl methacrylate, 4.8 g of a photoinitiator (IRG 651 from Ciba Geigy Inc.), and 2.4 g of butylated hydroxy toluene.

A printing plate was formed from the resulting polymer. The printing plate was transparent to visual inspection. The following properties were determined: softness=46 Shore A; resilience=50%; wash rate over 20 minutes to give 18 mil relief=0.9 mil/min in 2% $Na_2CO_3$.

Various modifications of the invention, in addition to those described herein, will be apparent to those skilled in the art from the foregoing description. Such modifications are intended to fall within the scope of the appended claims.

What is claimed is:

1. A synthetic method comprising the steps of:
   providing a mixture of ethylenically unsaturated monomers, at least one of said monomers being a surfactant monomer having the structure:

$$R_1—C=C—R_2$$

wherein $R_1$ is a hydrophobic moiety and $R_2$ is a hydrophilic moiety;
   reacting said monomers for a time and under conditions which effect polymerization thereof, thereby forming a latex polymer; and
   mixing said latex polymer with at least one ethylenically unsaturated rubber, at least one ethylenically unsaturated monomer and at least one photoinitiator.

2. The method of claim 1 wherein said mixture of ethylenically unsaturated monomers is present in aqueous media.

3. The method of claim 1 wherein said hydrophilic moiety is anionic.

4. The method of claim 1 wherein said hydrophilic moiety comprises at least one C=O, S=O, or P=O.

5. The method of claim 1 wherein said hydrophilic moiety comprises a carboxyl group.

6. The method of claim 1 wherein said hydrophobic moiety comprises an alkyl group having from 1 to about 30 carbon atoms or an alkenyl group having 2 to about 30 carbon atoms.

7. The method of claim 1 wherein said surfactant monomer is an alkenyl carboxylic acid or a salt thereof.

8. The method of claim 7 wherein said surfactant monomer is octenyl succinic acid or a salt thereof.

9. The method of claim 1 wherein said ethylenically unsaturated monomers are selected from the group consisting of alkyl acrylates, alkyl methacrylates, vinyl monomers, and diene monomers.

10. The method of claim 1 wherein said rubber is selected from the group consisting of polyisoprene, elastomeric terpolymers of ethylene, propylene and diene monomers; neoprenes; butyl rubbers; rubbers derived from butadiene; and nitrile rubbers.

11. The method of claim 1 further comprising drying said latex polymer prior to said mixing step.

12. A photocurable composition comprising:
    an ethylenically unsaturated rubber;
    at least one photoinitiator; and
    the reaction product produced by polymerizing a mixture of ethylenically unsaturated monomers, at least one of said monomers being a surfactant monomer having the structure:

$$R_1—C=C—R_2$$

wherein $R_1$ is a hydrophobic moiety and $R_2$ is a hydrophilic moiety.

13. The composition of claim 12 wherein said ethylenically unsaturated rubber has a refractive index which differs from the refractive index of the polymerization reaction product by no more than about 0.006.

14. The composition of claim 12 wherein said hydrophilic moiety is anionic.

15. The composition of claim 12 wherein said hydrophilic moiety comprises at least one C=O, S=O, or P=O.

16. The composition of claim 12 wherein said hydrophilic moiety comprises a carboxyl group.

17. The composition of claim 12 wherein said hydrophobic moiety comprises an alkyl group having from 1 to about 30 carbon atoms or an alkenyl group having from 2 to about 30 carbon atoms.

18. The composition of claim 12 wherein said surfactant monomer is an alkenyl carboxylic acid or a salt thereof.

19. The composition of claim 18 wherein said surfactant monomer is octenyl succinic acid or a salt thereof.

20. The composition of claim 12 wherein said ethylenically unsaturated monomers are selected from the group consisting of alkyl acrylates, alkyl methacrylates, vinyl monomers, and diene monomers.

21. The composition of claim 12 wherein said ethylenically unsaturated rubber constitutes from about 10 percent to about 90 percent by weight of said composition.

22. The composition of claim 12 wherein said reaction product constitutes from about 50 percent to about 90 percent by weight of said composition.

23. A photocurable element comprising a support layer and the photocurable composition of claim 12 disposed upon said support layer.

* * * * *